United States Patent
Sasaki et al.

(10) Patent No.: US 11,588,099 B2
(45) Date of Patent: Feb. 21, 2023

(54) RESERVOIR ELEMENT AND NEUROMORPHIC ELEMENT

(71) Applicant: TDK CORPORATION, Tokyo (JP)

(72) Inventors: Tomoyuki Sasaki, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 796 days.

(21) Appl. No.: 16/566,003

(22) Filed: Sep. 10, 2019

(65) Prior Publication Data
US 2020/0083434 A1    Mar. 12, 2020

(30) Foreign Application Priority Data
Sep. 12, 2018 (WO) ................. PCT/JP2018/033798

(51) Int. Cl.
| | |
|---|---|
| *H01L 43/02* | (2006.01) |
| *G06N 3/063* | (2006.01) |
| *G06N 3/08* | (2006.01) |
| *H01L 43/10* | (2006.01) |
| *G06N 3/04* | (2006.01) |
| *H01L 43/12* | (2006.01) |

(52) U.S. Cl.
CPC .......... *H01L 43/02* (2013.01); *G06N 3/0445* (2013.01); *G06N 3/063* (2013.01); *G06N 3/08* (2013.01); *H01L 43/10* (2013.01); *H01L 43/12* (2013.01)

(58) Field of Classification Search
CPC ........ G06N 3/0445; G06N 3/063; G06N 3/08; H01L 43/10
See application file for complete search history.

(56) References Cited

U.S. PATENT DOCUMENTS

| | | | |
|---|---|---|---|
| 8,194,364 B2 * | 6/2012 | Hara | H01L 43/08 360/324.12 |
| 2004/0091748 A1 * | 5/2004 | Kamata | B82Y 10/00 428/848.3 |
| 2012/0251847 A1 * | 10/2012 | Takenaga | G11C 11/161 428/836 |
| 2017/0116515 A1 | 4/2017 | Abel et al. | |
| 2019/0035446 A1 | 1/2019 | Shibata et al. | |

FOREIGN PATENT DOCUMENTS

WO    2017/213261 A1    12/2017

OTHER PUBLICATIONS

Bhuyan, P. D., Gupta, S. K., Singh, D., Sonvane, Y., & Gajjar, P. N. (2018). Electronic, Magnetic and Optical Properties of 2D Metal Nanolayers: A DFT Study. Metals and Materials International, 24(4), 904-912. (Year: 2018).*

(Continued)

*Primary Examiner* — Brian M Smith
*Assistant Examiner* — Lokesha G Patel
(74) *Attorney, Agent, or Firm* — Oliff PLC

(57) ABSTRACT

A reservoir element of the first aspect of the present disclosure includes: a first ferromagnetic layer; a plurality of second ferromagnetic layers positioned in a first direction with respect to the first ferromagnetic layer and spaced apart from each other in a plan view from the first direction; and a nonmagnetic layer positioned between the first ferromagnetic layer and the second ferromagnetic layers.

14 Claims, 12 Drawing Sheets

(56) References Cited

OTHER PUBLICATIONS

Sharad, Mrigank, Charles Augustine, Georgios Panagopoulos, and Kaushik Roy. "Spin-based neuron model with domain-wall magnets as synapse." IEEE Transactions on Nanotechnology 11, No. 4 (2012): 843-853. (Year: 2012).*

Sharad et al. "Spin-Based Neuron Model With Domain-Wall Magnets as Synapse." IEEE Transactions on Nanotechnology, IEEE Service Center, Piscataway, NJ, US, vol. 11, No. 4, Jul. 1, 2012, pp. 843-853, XP011454852, ISSN: 1536-125X, DOI:10.1109/TNANO. 2012.2202125.

Mar. 19, 2020 Search Report issued in European Patent Application No. 19196454.3.

Sasaki et al. "Spin Transport in Non-degenerate Si with a Spin MOSFET Structure at Room Temperature." Physical Review Applied 2, Sep. 10, 2014, , 034005.

Slonczewski. "Current-driven excitation of magnetic multilayers." Journal of Magnetism and Magnetic Materials, 1996, vol. 159, L1-L7.

Sasaki et al. "Electrical Spin Injection into Silicon Using MgO Tunnel Barrier." Applied Physical Express 2, 2009, 053003-1-053003-3.

Torrejon et al. "Neuromorphic computing with nanoscale spintronic oscillators." Nature, Jul. 27, 2017, vol. 547, 428-431.

* cited by examiner

RESERVOIR ELEMENT AND NEUROMORPHIC ELEMENT

BACKGROUND OF THE INVENTION

Field of the Invention

The present disclosure relates to a reservoir element and a neuromorphic element.

Description of Related Art

The neuromorphic element is an element that mimics a human brain by means of a neural network. Neuromorphic elements artificially mimic the relationship between neurons and synapses in the human brain.

The Hierarchical element is one of the neuromorphic elements. The hierarchical element has a hierarchically arranged chips (neurons in the brain) and means of communication (synapses in the brain) that connects them. The hierarchical element increases the correct answer rate of problems by means of transmission (synapses) performing a learning process (leaning) Learning means finding information that can be used in the future. The neuromorphic element weights input data. Leaning is performed in each level in the hierarchical element.

Learning at each level, however, increases in the number of chips (neurons) impose a significant burden on circuit design and contribute to increased power consumption of the neuromorphic elements. Reservoir computers are being studied as one way to reduce this burden.

The reservoir computer is one of the neuromorphic elements. The reservoir computer includes a reservoir element and an output part. The reservoir element includes chips that interact with each other. The chips interact with each other by the input signal and output the signal. Weights are fixed in transmission means connecting multiple chips and the transmission means is not able to learn. The output part learns from the signal from the reservoir element and outputs the outcome to the outside. The reservoir computer compresses the data with a reservoir element and weights the data at the output part to increase the correct answer rate of the problem. Learning on the reservoir computer is done only at the output part. Reservoir computers are expected to be one means of enabling simplified circuit design and increased power consumption efficiency of neuromorphic elements.

Non-Patent Document 1 describes a neuromorphic element using a spin torque oscillator (STO) element as a chip (neuron).

CITATION LIST

Non Patent Documents

[Non Patent Document 1] Jacob Torrejon et al., Nature, Vol. 547, pp. 428-432 (2017)

SUMMARY

However, the neuromorphic element using the STO element on the chip needs to align the resonance frequencies of each STO element. The resonance frequencies of the STO elements may vary depending on manufacturing errors, etc., and the STO elements may not interact sufficiently because of the above-described discrepancy. The STO element also oscillates by applying a high frequency current in a lamination direction. The long-term application of high frequency current in the lamination direction of the STO element having an insulating layer can cause failure of the STO element.

The present disclosure has been made in view of the above-described circumstances and provides a stable operating reservoir element and a neuromorphic element.

Means for Solving Problems

The present disclosure provides the following means for solving the above-described problems.

(1) The first aspect of the present disclosure is a reservoir element including: a first ferromagnetic layer; a plurality of second ferromagnetic layers positioned in a first direction with respect to the first ferromagnetic layer and spaced apart from each other in a plan view from the first direction; and a nonmagnetic layer positioned between the first ferromagnetic layer and the second ferromagnetic layers.

(2) The reservoir element related to the above-described aspect may further include at least one via wiring electrically connected to the first ferromagnetic layer on a surface opposite to a surface with the nonmagnetic layer.

(3) In the reservoir element related to the above-described aspect, the at least one via wiring may include a plurality of via wirings, and each of via wirings may is located on a position overlapping with each of the second ferromagnetic layers, respectively, in the plan view from the first direction.

(4) The reservoir element related to the above-described aspect may further include a magnetic interference layer contacting the first ferromagnetic layer on the surface opposite to the surface with the nonmagnetic layer and having a coercivity lower than a coercivity of the first ferromagnetic layer.

(5) In the reservoir element related to the above-described aspect, the magnetic interference layer may be made of an alloy containing one of Fe—Si, Fe—Si—Al, Fe—Co—V, Ni—Fe, and Co—Fe—Si—B.

(6) The reservoir element related to the above-described aspect may further include a shared electrode connecting two or more of the via wirings.

(7) In the reservoir element related to the above-described aspect, the second ferromagnetic layers may be arranged in a hexagonal lattice form in the plan view from the first direction.

(8) In the reservoir element related to the above-described aspect, the second ferromagnetic layers may form plurality of bundles, the second ferromagnetic layers being close-packed in each of the bundles in the plan view from the first direction, and the second ferromagnetic layers may be arranged in a hexagonal lattice form.

(9) The second aspect of the present disclosure is a neuromorphic element including: the reservoir element according to any one of the above-described reservoir element; an input part connected to the reservoir element; and an output part connected to the reservoir element, the output part being configured to perform learning process on a signal from the reservoir element.

The reservoir and the neuromorphic element related to embodiment of the present disclosure are capable of stable operation.

EMBODIMENTS

Hereinafter, the present embodiments will be described in detail with reference to the drawings. The drawings used in the following description may enlarge the characterizing portions for convenience in order to make the features understandable, and the dimensional ratios of each component may differ from the actual ones. The materials, dimensions, etc. illustrated in the following description are exemplary, and the present disclosure is not limited thereto, and may be implemented with appropriate modifications to the extent that the effects of the present disclosure are achieved.

First Embodiment

Figure 1:
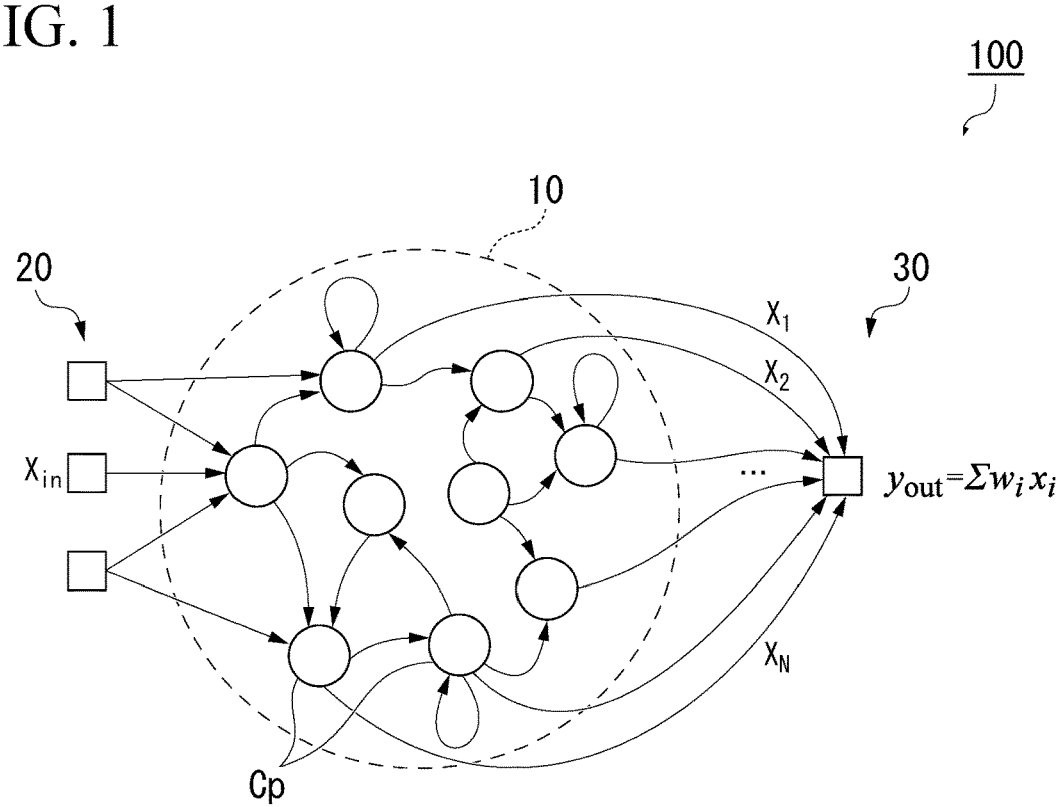
FIG. 1 is a conceptual diagram of a neuromorphic element according to the first embodiment.

FIG. 1 is a conceptual diagram of a neuromorphic element according to the first embodiment. The neuromorphic element 100 includes the input part 20, the reservoir element 10, and the output part 30. The input part 20 and the output part 30 are connected to the reservoir element 10.

The neuromorphic element 100 compresses the signal input from the input part 20 with the reservoir element 10, weights (learns) the signal compressed by the output part 30, and outputs the signal to the outside.

The input part 20 transmits a signal input from an external source to the reservoir element 10. The input part 20 includes, for example, input terminals. The input terminals sense information external to the neuromorphic element 100 and input information as a signal to the reservoir element 10. The signal may be input to the reservoir element 10 continuously over time with changes in external information or may be divided into a predetermined time domain and input to the reservoir element 10.

The reservoir element 10 has chips Cp. Multiple chips Cp interact with each other. The signal input to the reservoir element 10 has a number of information. The large number of information contained in the signal is compressed to the information required by the interaction of multiple chips Cp with each other. The compressed signal is transmitted to the output part 30. The reservoir element 10 does not perform learning process. That is, the multiple chips Cp only interact with each other and do not weight the signals that transmit between the multiple chips Cp.

The output part 30 receives a signal from the chip Cp of the reservoir element 10. The output part 30 performs learning process. The output part 30 weights each signals from each of chips Cp by leaning. The output part 30 includes, for example, a non-volatile memory. The non-volatile memory is, for example, a magnetoresistive effect element. The output part 30 outputs a signal to the outside of the neuromorphic element 100.

The neuromorphic element 100 compresses the data with the reservoir element 10 and weights the data with the output part 30 to increase the correct answer rate of the problem.

The neuromorphic element 100 also has excellent power consumption efficiency. Only the output part 30 learns in the neuromorphic element 100. Learning is to adjust the weight of the signal transmitted from each chip Cp. The weight of the signal is determined according to the importance of the signal. When the weight of the signal is adjusted from time to time, the circuitry between the chips Cp becomes active. The more active circuitry is, the higher the power consumption of the neuromorphic element 100. In the neuromorphic element 100, only the output part 30 leans in the final stage and the neuromorphic element 100 has excellent in power consumption efficiency.

Figure 2:
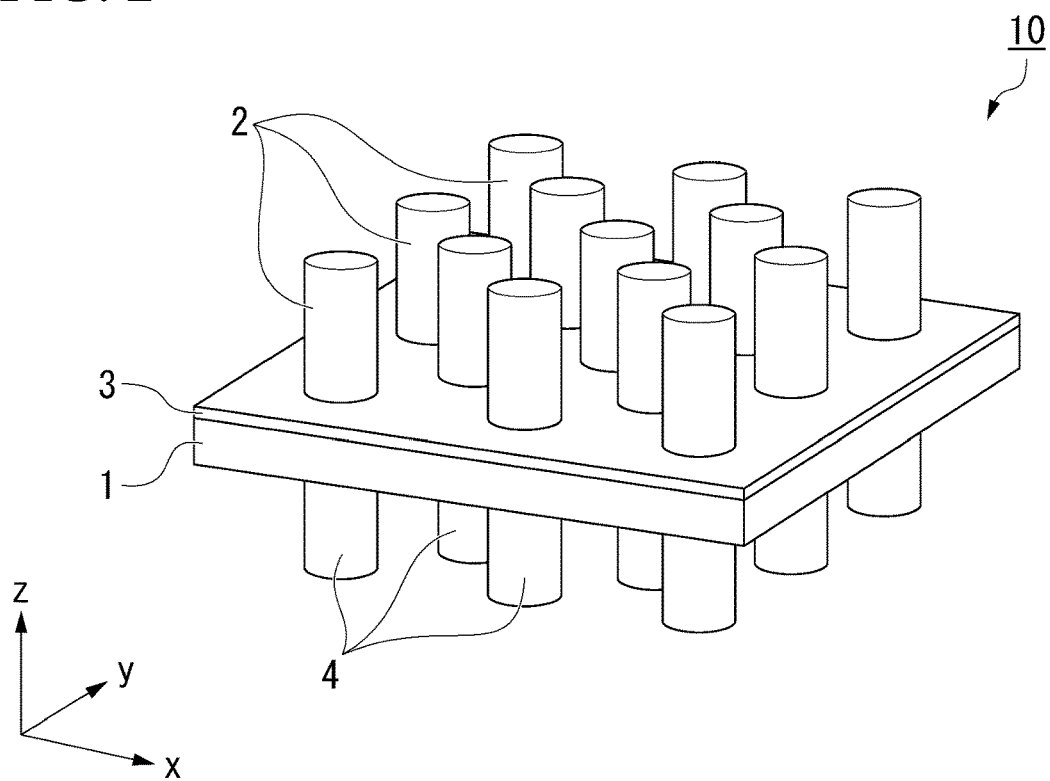
FIG. 2 is a perspective view of the reservoir element according to the first embodiment.
Figure 3:
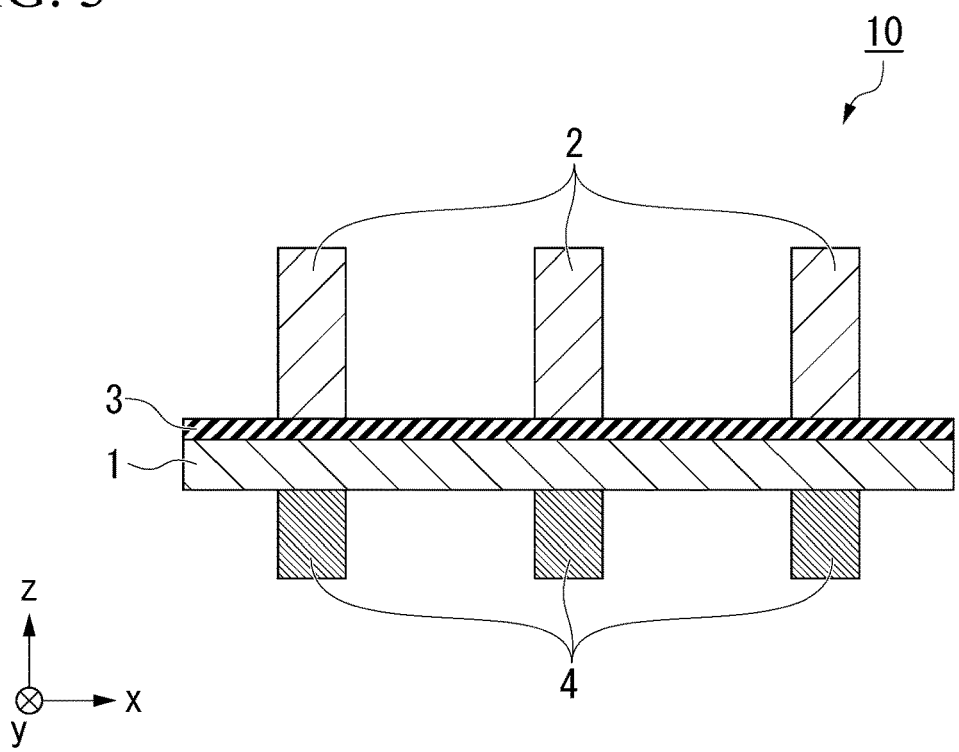
FIG. 3 is a side view of the reservoir element according to the first embodiment.
Figure 4:
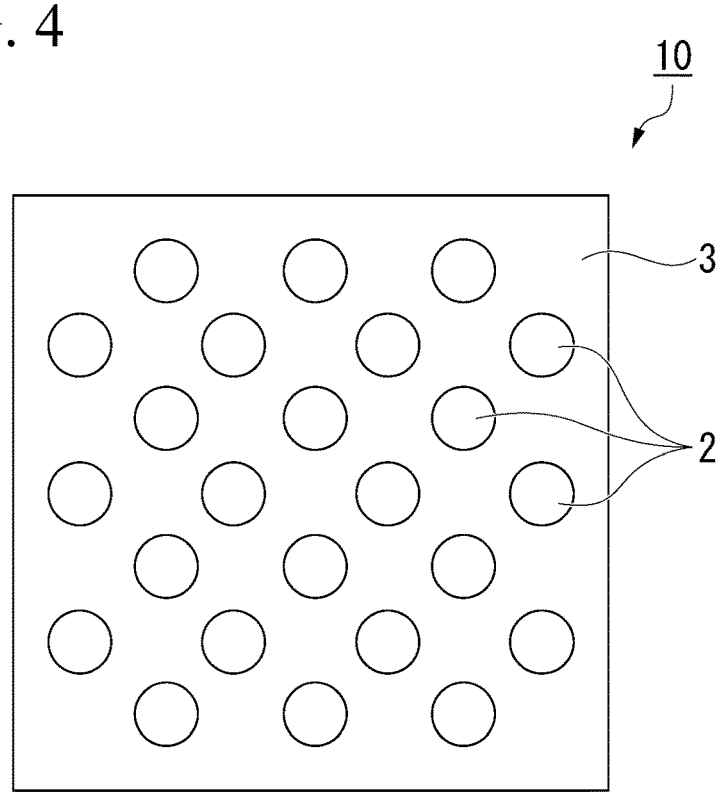
FIG. 4 is a plan view of a reservoir element according to the first embodiment.

FIG. 2 is a perspective view of a reservoir element 10 according to the first embodiment. FIG. 3 is a side view of the reservoir element 10 according to the first embodiment. FIG. 4 is a plan view of the reservoir element 10 according to the first embodiment.

The reservoir element 10 includes the first ferromagnetic layer 1, the second ferromagnetic layers 2, the nonmagnetic layer 3, and the via wirings 4. The second ferromagnetic layers 2 correspond to the chips Cp in FIG. 1.

The directions are specified as described below. A predetermined direction in the extended surface of the first ferromagnetic layer 1 is defined as the x-direction. Among the plane that the first ferromagnetic layer 1 is extended, a direction intersecting (e.g., generally in the perpendicular direction) the x direction is defined as the y-direction. A direction intersecting (e.g., generally in the perpendicular direction) the plane that the first ferromagnetic layer 1 is extended is defined as the z-direction.

The first ferromagnetic layer 1 extends continuously on the xy-plane. The first ferromagnetic layer 1 may be a perpendicular magnetizing film in which the magnetization easy axis is oriented in the z-direction or an in-plane magnetized film in which the magnetization easy axis is oriented in the xy-plane direction.

The first ferromagnetic layer 1 includes a ferromagnetic material. The first ferromagnetic layer 1 includes, for example, a metal selected from the group consisting of Cr, Mn, Co, Fe, and Ni, an alloy comprising one or more of these metals, an alloy including these metals and at least one or more of B, C, and N. The first ferromagnetic layer 1 is, for example, Co—Fe, Co—Fe—B, Ni—Fe, Co—Ho alloy (CoHo$_2$), Sm—Fe alloy (SmFe$_{12}$). If the first ferromagnetic layer 1 includes a Co—Ho alloy (CoHo$_2$) and a Sm—Fe alloy (SmFe$_{12}$), the first ferromagnetic layer 1 is prone to become an in-plane magnetized film.

The first ferromagnetic layer 1 may be a Heusler alloy. The Heusler alloy is an intermetallic compound having a chemical composition of XYZ or X$_2$YZ. X is a transition metal of a Co group, an Fe group, a Ni group or a Cu group; or a noble metal element. Y is a transition metal of an Mn group, a V group, a Cr group or a Ti group; or the element species of X. Z is a typical element from Group III to Group V. The Heusler alloys are, for example, Co$_2$FeSi, Co$_2$FeGe, Co$_2$FeGa, Co$_2$MnSi, Co$_2$Mn$_{1-a}$Fe$_a$Al$_b$Si$_{1-b}$, and Co$_2$FeGe$_{1-c}$Ga$_c$. The Heusler alloys have a high spin polarizability and more strongly develop a magnetoresistance effect.

The first ferromagnetic layer 1 preferably contains at least one element selected from the group consisting of Co, Ni, Pt, Pd, Gd, Tb, Mn, Ge, Ga. Examples include: a Co and Ni laminate; a Co and Pt laminate; a Co and Pd laminate; a MnGa-based material; a GdCo-based materials; and a TbCo-based materials. Ferrimagnetic materials such as a MnGa-based material; a GdCo-based material; and a TbCo-based material, have low saturation magnetization and low threshold current required to move the magnetic wall.

The second ferromagnetic layer 2 is formed on one surface of the nonmagnetic layer 3. The second ferromagnetic layers 2 projects in the z-direction and exist on the xy-plane spaced from each other. The multiple second ferromagnetic layer 2 are present with respect to a single first ferromagnetic layer 1. The adjacent second ferromagnetic layers 2 are, for example, insulated with interlayer insulator films.

The second ferromagnetic layers 2 are arranged in a hexagonal lattice form, for example, in plane view from the z-direction (see FIG. 4). The signal input to the second ferromagnetic layers 2 propagate in the first ferromagnetic layer 1. When the second ferromagnetic layers 2 are arranged in a hexagonal lattice form, the signal input from the second ferromagnetic layers 2 are likely to interfere with the signal input from the other second ferromagnetic layers 2.

Figure 5:
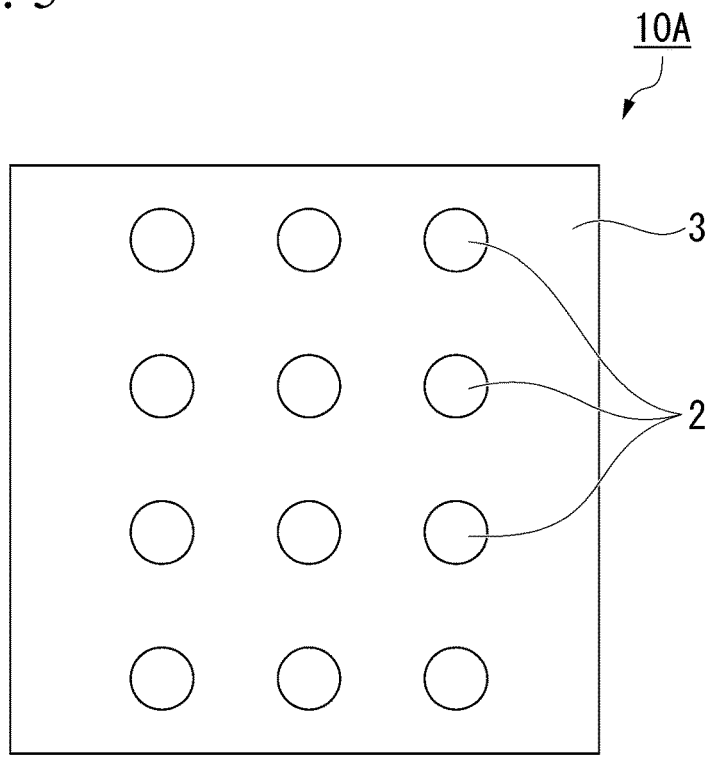
FIG. 5 is a plan view of another example of a reservoir element according to the first embodiment.
Figure 6:
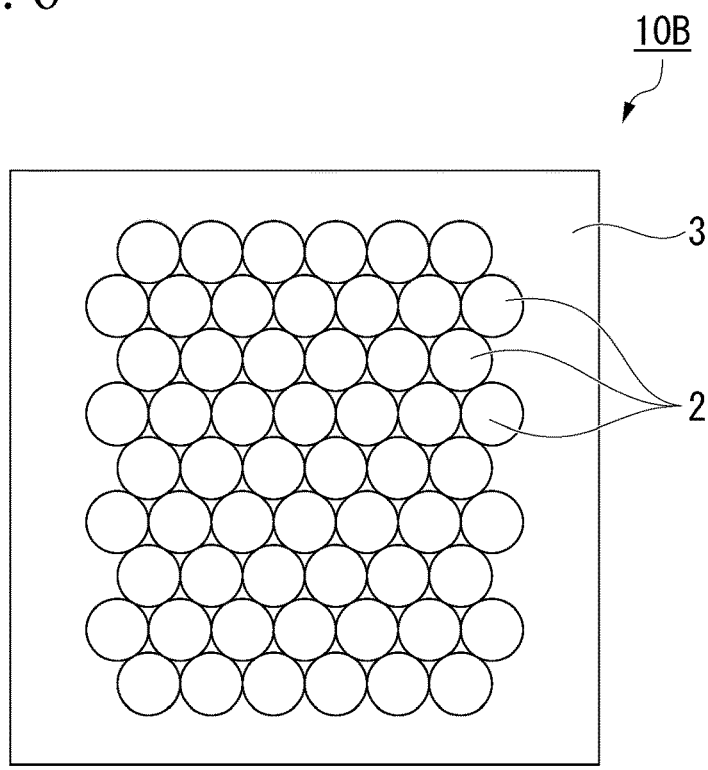
FIG. 6 is a plan view of another example of a reservoir element according to the first embodiment.
Figure 7:
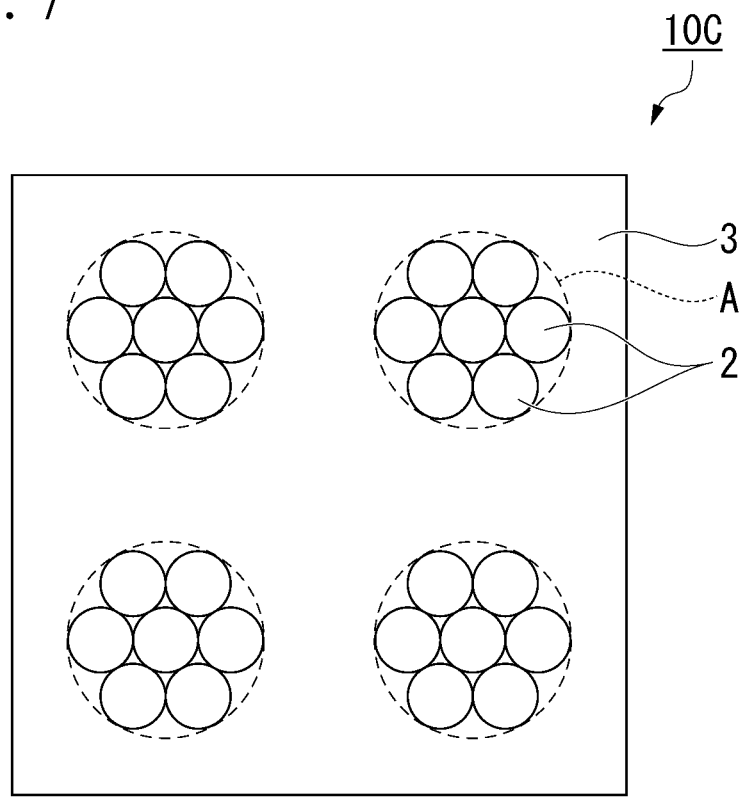
FIG. 7 is a plan view of another example of a reservoir element according to the first embodiment.

The arrangement of the second ferromagnetic layers 2 is not limited to the case of FIG. 4. FIGS. 5-7 are plane views of other examples of the reservoir elements according to the first embodiment.

The reservoir element 10A shown in FIG. 5 has multiple second ferromagnetic layers 2 arranged in a square lattice. The distance between adjacent second ferromagnetic layer 2 is equal and the input signal is homogenized.

The reservoir element 10B shown in FIG. 6 has multiple second ferromagnetic layers 2 placed close together in a hexagonal lattice form. As the density of the second ferromagnetic layer 2 increases, the signal input to the second ferromagnetic layer 2 is likely to interfere with each other. Even in this case, the second ferromagnetic layers 2 are insulated from each other.

The reservoir element 10C shown in FIG. 7 forms multiple bundles A in which the second ferromagnetic layers 2 are densely packed. In bundle A, the second ferromagnetic layers 2 are arranged in a hexagonal lattice form. The adjacent second ferromagnetic layers 2 are insulated. The conditions of mutual interference differ between the signals input to the second ferromagnetic layer 2 constituting one bundle A and the signals input to the second ferromagnetic layers 2 constituting a different bundle A. By adjusting the conditions of mutual interference in the reservoir element 10C, the reservoir element 10C emphasizes a particular signal and transmits it to the output part 30.

For example, the shape of each second ferromagnetic layers 2 is a cylindrical shape (see FIG. 1). The shape of the second ferromagnetic layers 2 is not limited to a cylindrical shape. The shape of the second ferromagnetic layer 2 may be, for example, an ellipsoidal shape, a rectangular cylinder, a cone, an ellipsoidal cone, a frustum, a square frustum, and the like.

The second ferromagnetic layer 2 contains a ferromagnetic material. The ferromagnetic material used in the second ferromagnetic layer 2 is the same as the material used in the first ferromagnetic layer 1.

The direction of the magnetization of the second ferromagnetic layer 2 is harder to be changed than that of the first ferromagnetic layer 1. Accordingly, the second ferromagnetic layer 2 is referred as a magnetization fixed layer. The magnetization of the second ferromagnetic layer 2 is fixed to the magnetization of the first ferromagnetic layer 1 by adjusting the material used in the first ferromagnetic layer 1 and the second ferromagnetic layer 2 and the layer configuration adjacent to the second ferromagnetic layer 2, for example. For example, when a material having a higher coercivity than the material constituting the first ferromagnetic layer 1 is used in the second ferromagnetic layer 2, the magnetization of the second ferromagnetic layer 2 is fixed to the magnetization of the first ferromagnetic layer 1. Further, for example, when an antiferromagnetic layer is stacked with the second ferromagnetic layer on the surface opposite to the surface with the nonmagnetic layer 3 and the antiferromagnetic layer and the second ferromagnetic layer 2 are antiferromagnetic-coupled, the magnetization of the second ferromagnetic layer 2 is fixed to the magnetization of the first ferromagnetic layer.

The nonmagnetic layer 3 is positioned between the first ferromagnetic layer 1 and the second ferromagnetic layers 2. The nonmagnetic layer 3 extends continuously, for example, on the xy-plane. The nonmagnetic layer 3 may be scattered on the xy-plane only at a position between the first ferromagnetic layer 1 and the second ferromagnetic layer 2.

The nonmagnetic layer 3 is made of a nonmagnetic material.

When the nonmagnetic layer 3 is an insulator (when it is a tunneling barrier layer), the nonmagnetic layer 3 is, for example, an Al$_2$O$_3$, SiO$_2$, MgO, MgAl$_2$O$_4$, and the like. The nonmagnetic layer 3 may also be a material or the like in which a portion of Al, Si, or Mg in the above-described material is replaced with Zn, Be, or the like. By choosing MgO or MgAl$_2$O$_4$, the coherent tunneling between the first ferromagnetic layer 1 and the second ferromagnetic layer 2 can be realized. In that case, spins can be efficiently injected from the first ferromagnetic layer 1 to the second ferromagnetic layer 2. When the nonmagnetic layer 3 is made of a metal, the nonmagnetic layer 3 is, for example, Cu, Au, Ag, and the like. When the nonmagnetic layer 3 is a semiconductor, the nonmagnetic layer 3 is, for example, Si, Ge, CuInSe$_2$, CuGaSe$_2$, Cu(In, Ga)Se$_2$, and the like.

The via wiring 4 is electrically connected to the first ferromagnetic layer 1 on the surface opposite to the surface with the nonmagnetic layer 3. The via wirings 4 may be directly connected to the first ferromagnetic layer 1 or may be connected via other layers. The via wirings 4 shown in FIGS. 1 and 3 project from the first ferromagnetic layer 1 in the z-direction. Multiple via wirings 4 exist on the xy-plane, each of them being spaced apart.

The via wiring 4 includes a conductor. The via wiring 4 is made of, for example, Cu, Al, Au. The adjacent via wirings 4 are insulated.

Each of the via wirings 4 shown in FIGS. 1 and 3 is disposed at a position corresponding to each of the second ferromagnetic layers 2. That is, each of the second ferromagnetic layers 2 and each of the via wirings 4 overlap with a plane view from the z-direction.

An example of a method for manufacturing the reservoir element 10 in the neuromorphic element 100 will now be described. FIGS. 8A-8D are cross-sectional views illustrating a method of manufacturing a reservoir element 10 according to the first embodiment.

Figure 8A:
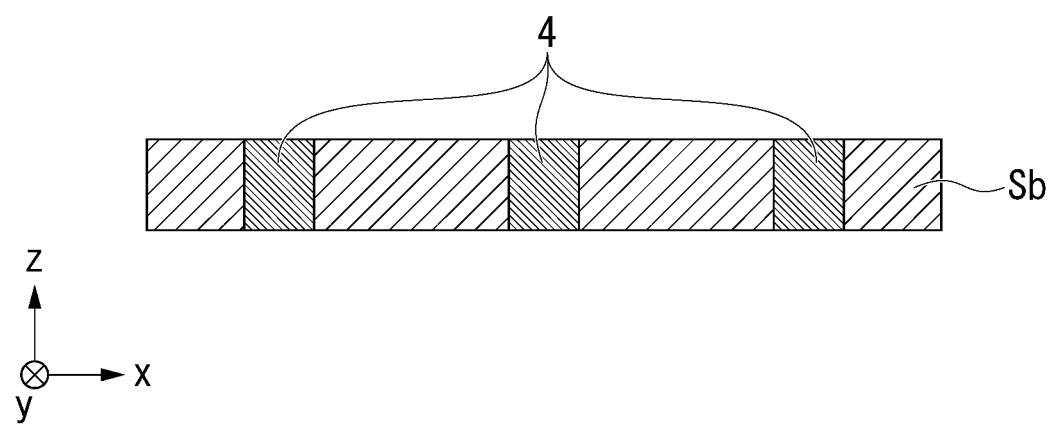
FIG. 8A is a cross-sectional view illustrating a method of manufacturing a reservoir element according to the first embodiment.

First, a hole is formed in the substrate Sb and the inside of the hole is filled with a conductor (FIG. 8A). The substrate Sb is, for example, a semiconductor substrate. The substrate Sb is preferably, for example, Si, AlTiC. When Si or AlTiC are used, it is easy to obtain a flat surface. The holes are formed, for example, using reactive ion etching (RIE). The conductor filling the hole becomes the via wiring 4.

Figure 8B:
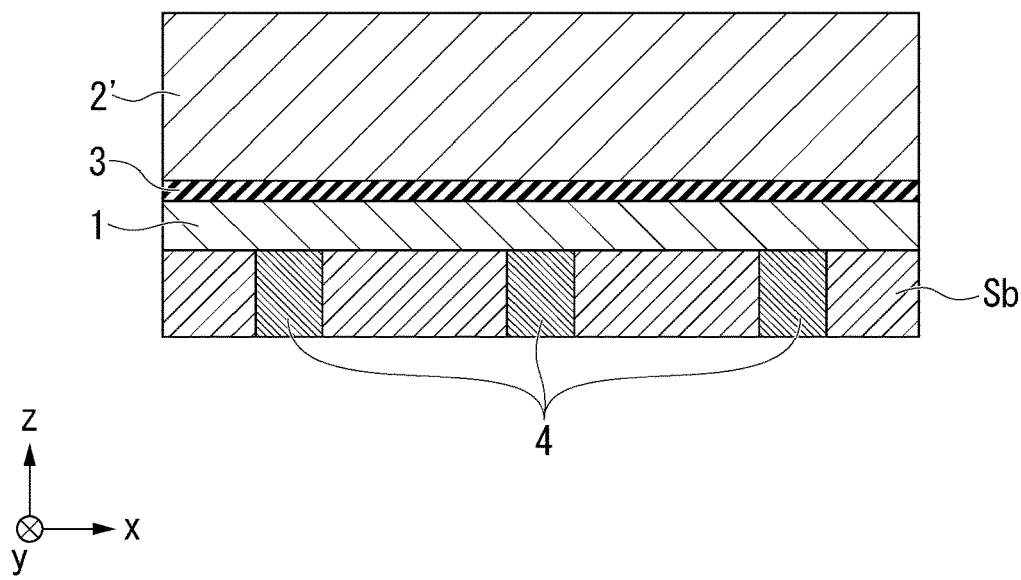
FIG. 8B is a cross-sectional view illustrating a method of manufacturing a reservoir element according to the first embodiment.

The surface of the substrate Sb and the via wirings 4 are then planarized by chemical mechanical polishing (CMP). The first ferromagnetic layer 1, the nonmagnetic layer 3, and the ferromagnetic layer 2' are laminated on the planarized substrate Sb and the via wirings 4 in this order (FIG. 8B). The first ferromagnetic layer 1, the nonmagnetic layer 3, and the ferromagnetic layer 2' are laminated using, for example, chemical vapor deposition (CVD).

Figure 8C:
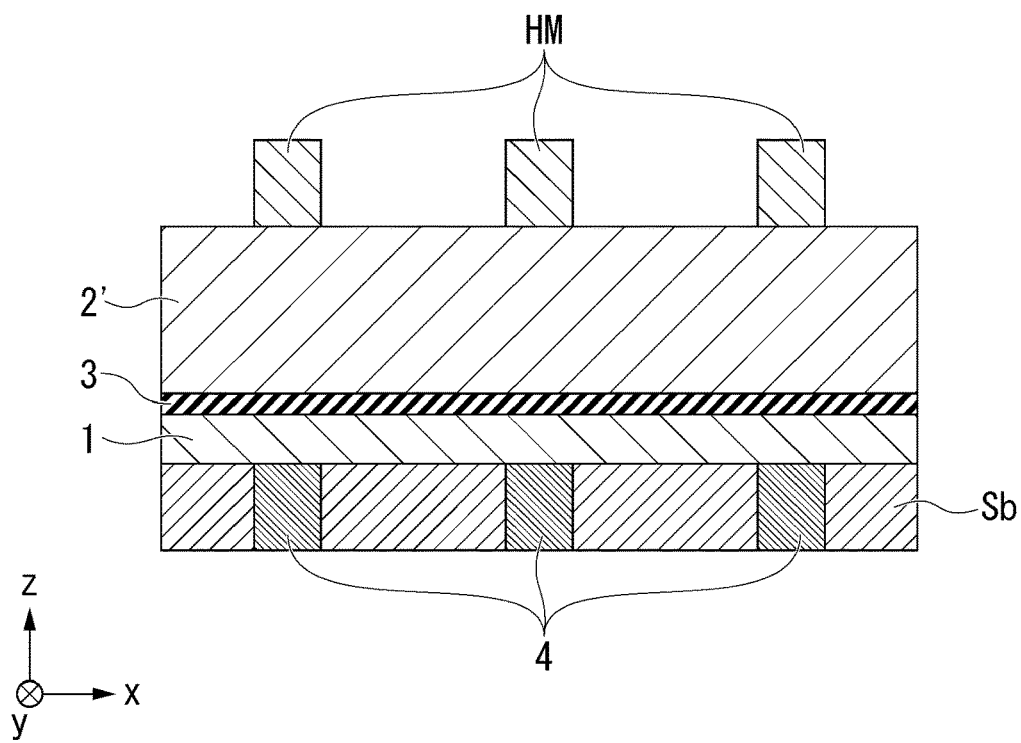
FIG. 8C is a cross-sectional view illustrating a method of manufacturing a reservoir element according to the first embodiment.
Figure 8D:
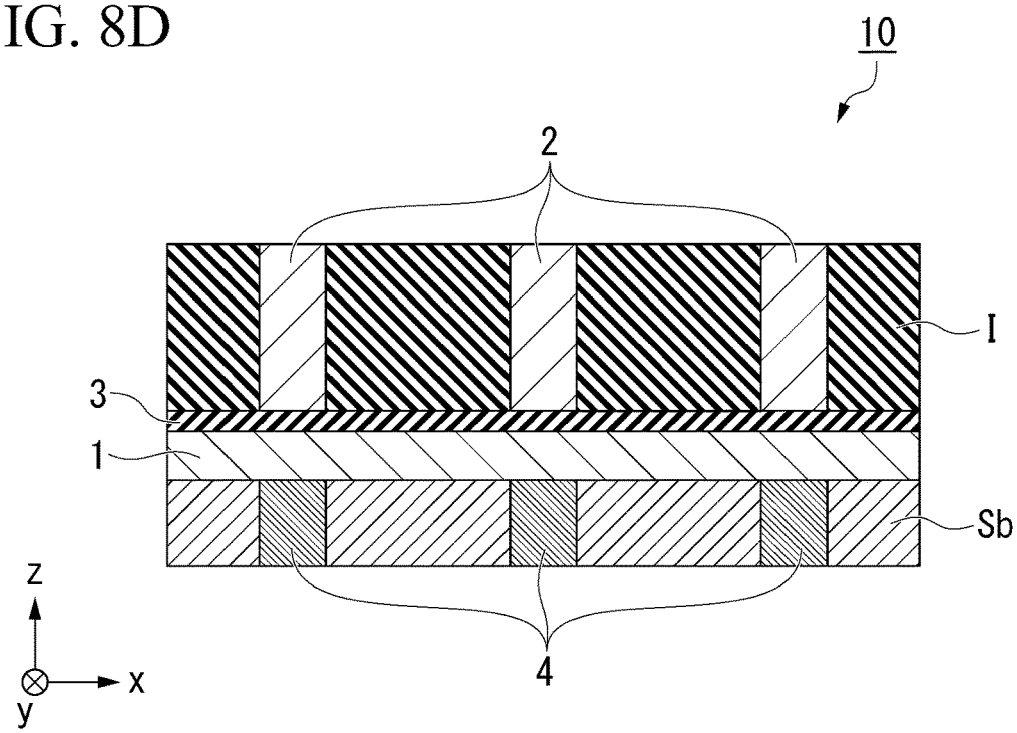
FIG. 8D is a cross-sectional view illustrating a method of manufacturing a reservoir element according to the first embodiment.

The hard mask HM is then formed at a predetermined position on the surface of the ferromagnetic layer 2' (FIG. 8C). The portion of the ferromagnetic layer 2' that is not coated with the hard mask HM is removed by RIE or ion milling. The ferromagnetic layer 2' is formed into multiple second ferromagnetic layers 2 by removing unwanted portions. Finally, the second ferromagnetic layers 2 are protected by the interlayer insulating film I (FIG. 8D). The above procedure yields the neuromorphic element 100 according to the first embodiment.

Figure 12:
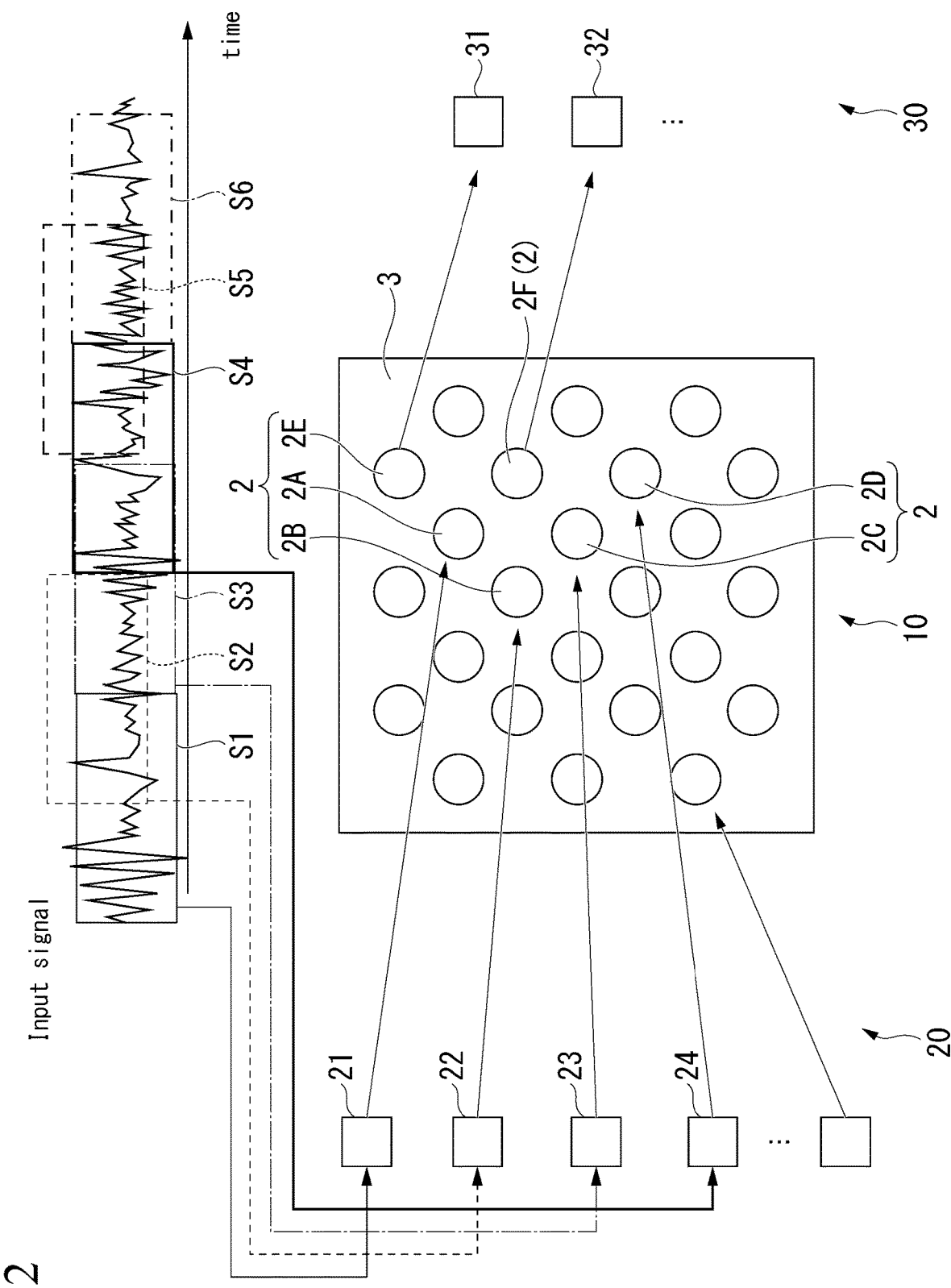
FIG. 12 is a schematic diagram illustrating an example of the operation of a neuromorphic element.

The function of the neuromorphic element 100 will then be described. FIG. 12 is a schematic diagram illustrating an example of operation of the neuromorphic element 100. The input part 20 includes multiple input terminals 21, 22, 23, 24, and the like. Each of the input terminals 21, 22, 23, 24 . . . , which comprise the input part 20, is connected to each of the second ferromagnetic layers 2 of the reservoir elements 10. The input part 20 receives an input signal from an external source. For example, the input signal is divided into time domains and is input to multiple input terminals 21, 22, 23, 24, etc. of the input part 20 as signals S1, S2, S3, S4, S5, and S6, respectively. An example is shown where the input signal is input without processing, but the signal can be input after the Fast Fourier Transform Analysis (FT analysis) is performed. FFT analysis is effective in extracting frequency characteristics. FFT analysis can also filter low amplitude signals due to noise. The input terminals 21, 22, 23, 24 . . . , which receive external signals, carry a write current from the corresponding second ferromagnetic layers 2A, 2B, 2C, 2D . . . toward the via wirings 4. For example, the input signal is divided in the order of the signal S1, the signal S2, the signal S3, and the signal S4 in chronological order. The write current flows in the order of the second ferromagnetic layer 2A in which the signal S1 is input, the second ferromagnetic layer 2B in which the signal S2 is input, the second ferromagnetic layer 2C in which the signal S3 is input, and the second ferromagnetic layer 2D in which the signal S4 is input. If each of the via wirings 4 is disposed at a position corresponding to each of the plurality of second ferromagnetic layers 2, most of the write currents flow in the z-direction.

The write current is spin polarized by the second ferromagnetic layers 2A, 2B, 2C, and 2D and reaches to the first ferromagnetic layer 1. The spin polarized current provides a spin transfer torque (STT) for magnetization of the first ferromagnetic layer 1. The first magnetization of the first ferromagnetic layer near the second ferromagnetic layer in which the write current flows is rotated by the STT. Magnetic rotation propagates around the periphery, depending on the time and amount of application of the write current, such that the water droplet spreads the ripple. Accordingly, a structure in which a magnetic wall is formed between a portion of the first ferromagnetic layer 1 in which the magnetization is rotated and a portion of the first ferromagnetic layer 1 in which the magnetization is not rotated, and the magnetic wall spreads by the magnetic rotation propagating in the first ferromagnetic layer 1. As a result, directions of magnetization of the first ferromagnetic layer 1 differ in: the vicinities of the second ferromagnetic layers 2A, 2B, 2C and 2D in which the write current has flown; and other parts in which the write current has not flown. Thus, multiple magnetic domains are formed in the first ferromagnetic layer 1.

The range of the magnetic domain in the vicinity of the second ferromagnetic layer 2A, 2B, 2C, and 2D to which the write current is applied varies with the time of application of the write current and the amount applied so that the range of ripples spreads depending on the size and speed of the water droplets dropped onto the water surface. When the amount of writing current is high, the range of magnetic domains formed in the vicinity of the second ferromagnetic layers 2A, 2B, 2C, and 2D expands. The magnetic wall moves in a direction extending from the second ferromagnetic layer 2A, 2B, 2C, and 2D according to the expansion of the magnetic domain.

When the writing current flows from the second ferromagnetic layers 2A, 2B, 2C, and 2D toward the via wirings 4, a magnetic domain is formed near the respective second ferromagnetic layers 2A, 2B, 2C, and 2D. For example, when the magnetic rotation propagating from the second ferromagnetic layer 2A and the magnetic rotation propagating from the second ferromagnetic layer 2B interfere with each other, a magnetic domain reflecting this interference is formed between the second ferromagnetic layer 2A and the second ferromagnetic layer 2B. Therefore, the magnetic domain formed in the first ferromagnetic layer 1 reflects the interference of the magnetization rotation from each second ferromagnetic layer 2A, 2B, 2C, and 2D. Magnetization rotations propagating from the second ferromagnetic layer 2A and the magnetization rotations propagating from the second ferromagnetic layer 2B are more likely to interfere with each other than magnetization rotations propagating from the second ferromagnetic layer 2A and magnetization rotations propagating from the second ferromagnetic layer 2C. The distance between the second ferromagnetic layer 2A and the second ferromagnetic layer 2B is closer than the distance between the second ferromagnetic layer 2A and the second ferromagnetic layer 2C. That is, the closer the distance between the second ferromagnetic layer 2, the more likely the input signals S1, S2, S3, S4, S5, and S6 are to interfere with each other. The closer the time series is to signal S1, S2, S3, S4, S5, and S6, the more likely it is to interfere with each other. Therefore, it is preferable to input the signal S1, S2, S3, S4, S5, and S6, which are closer in time series, to the second ferromagnetic layer 2, which is closer in distance. For example, the distance between the second ferromagnetic layer 2A in which the signal S1 is input and the second ferromagnetic layer 2B in which the signal S2 is input is preferably closer to the distance between the second ferromagnetic layer 2A in which the signal S1 is input and the second ferromagnetic layer 2C in which the signal S3 is input. When the application of the writing current to the reservoir element 10 is stopped, the magnetic state of the first ferromagnetic layer 1 is stored in a non-volatile manner.

Finally, the signal is output from the reservoir element 10 to the output part 30. The output part 30 includes, for example, multiple output terminals 31, 32, . . . . The output terminals 31, 32 . . . are connected to any second ferromagnetic layer 2. FIG. 12 shows an example of connecting the input terminals 21, 22, 23, 24 . . . to the second ferromagnetic layers 2E, 2F that is different from the second ferromagnetic layers 2A, 2B, 2C, and 2D to which the input terminals 21, 22, 23, 24 . . . are connected. The input and output can be switched, and the output terminals 31 and 32 for the output can be connected to the second ferromagnetic layers 2A, 2B, 2C, and 2D to which the input terminals 21, 22, 23, 24, etc. for the input are connected. The signal is output by flowing a read current from the second ferromagnetic layer 2 toward the via wiring 4. The read current has a lower current density than the write current and does not rotate the magnetization of the first ferromagnetic layer 1.

When a reading current is passed through the reservoir element 10, a difference in the relative angles of the magnetization of the second ferromagnetic layer 2 and the magnetization of the first ferromagnetic layer 1 at a position overlapping the second ferromagnetic layer 2 is output as a change in the resistance value. The magnetization direction of the first ferromagnetic layer 1 at a position overlying the second ferromagnetic layer 2 is affected by a magnetic domain that extends from the vicinity of the other second ferromagnetic layers. That is, the signal read from the first second ferromagnetic layer 2 includes information written to the other second ferromagnetic layers 2, and the information is compressed.

Figure 13:
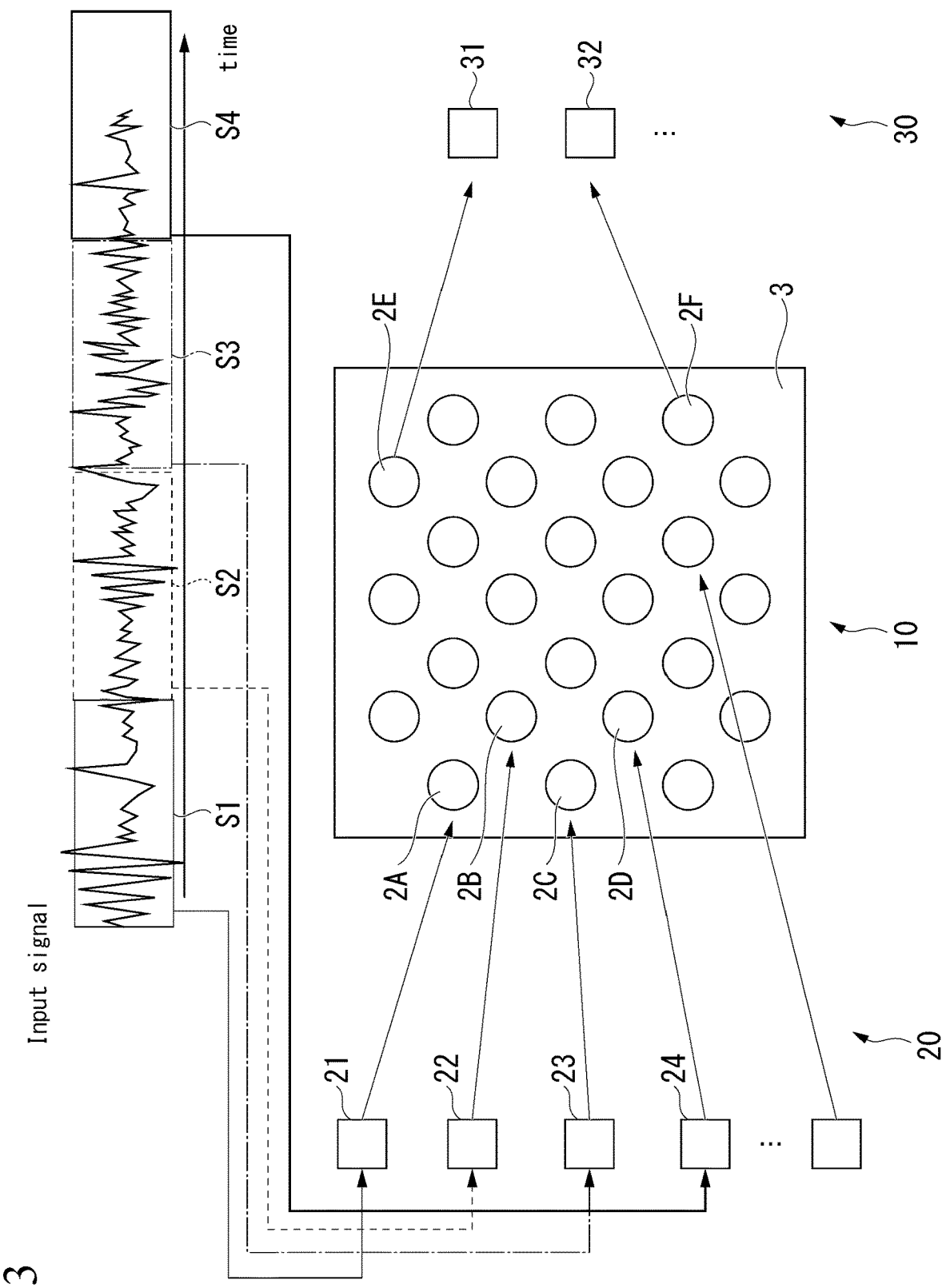
FIG. 13 is a schematic diagram illustrating another example of the operation of a neuromorphic element.

Finally, the compressed signal is transmitted to the output part 30 through multiple output terminals 31, 32, . . . . The output part 30 weights the signal read out from each of the second ferromagnetic layers 2 by learning. FIG. 13 is a schematic diagram illustrating another example of the operation of the neuromorphic element 100. In FIG. 13, the method of dividing the input signal, the connection points of the input terminals 21, 22, 23, and 24 and the connection points of the output terminals 31, 32, etc. are different from those shown in FIG. 12. In the example shown in FIG. 13, the input signals are divided into time series without overlapping into signals S1, S2, S3, S4, and so on. In the neuromorphic element shown in FIG. 13, the second ferromagnetic layers 2A, 2B, 2C, and 2D in which signals S1, S2, S3, and S4, which are separated from each other in time series, are inputted are arranged in such a way that the distances from each other are separated becomes longer from the second ferromagnetic layers 2A, 2B, 2C and 2D.

Figure 14:
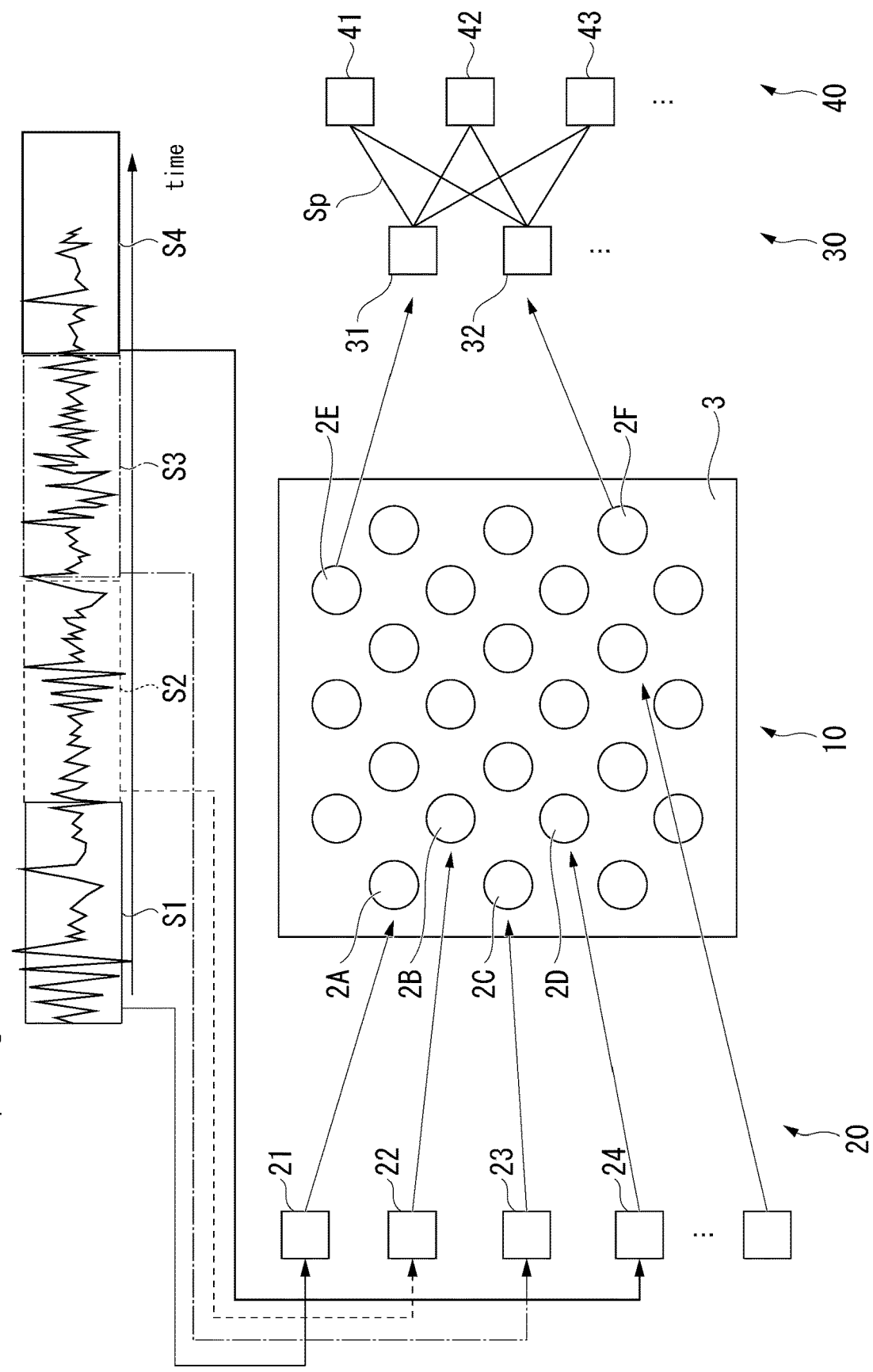
FIG. 14 is a schematic diagram illustrating another example of a neuromorphic element.

FIG. 14 is a schematic diagram illustrating another example of a neuromorphic element. The neuromorphic element shown in FIG. 14 has a second output part 40, which is different from the example shown in FIG. 13. Each of the terminals 41, 42, and 43 of the second output part 40 is connected to each of the output terminals 31, 32 . . . of the output part 30 via a synapse Sp. When information is transmitted from each of the output terminals 31, 32 . . . of the output part 30 to each of the terminals 41, 42, and 43 of the second output part 40, the data is weighted at the synapse Sp. The neuromorphic element shown in FIG. 14 performs leaning process between the output part 30 and the second output part 40. The neuromorphic element shown in FIG. 14 is able to recognize more complex information by having a structure of a deep neural network.

Figure 15:
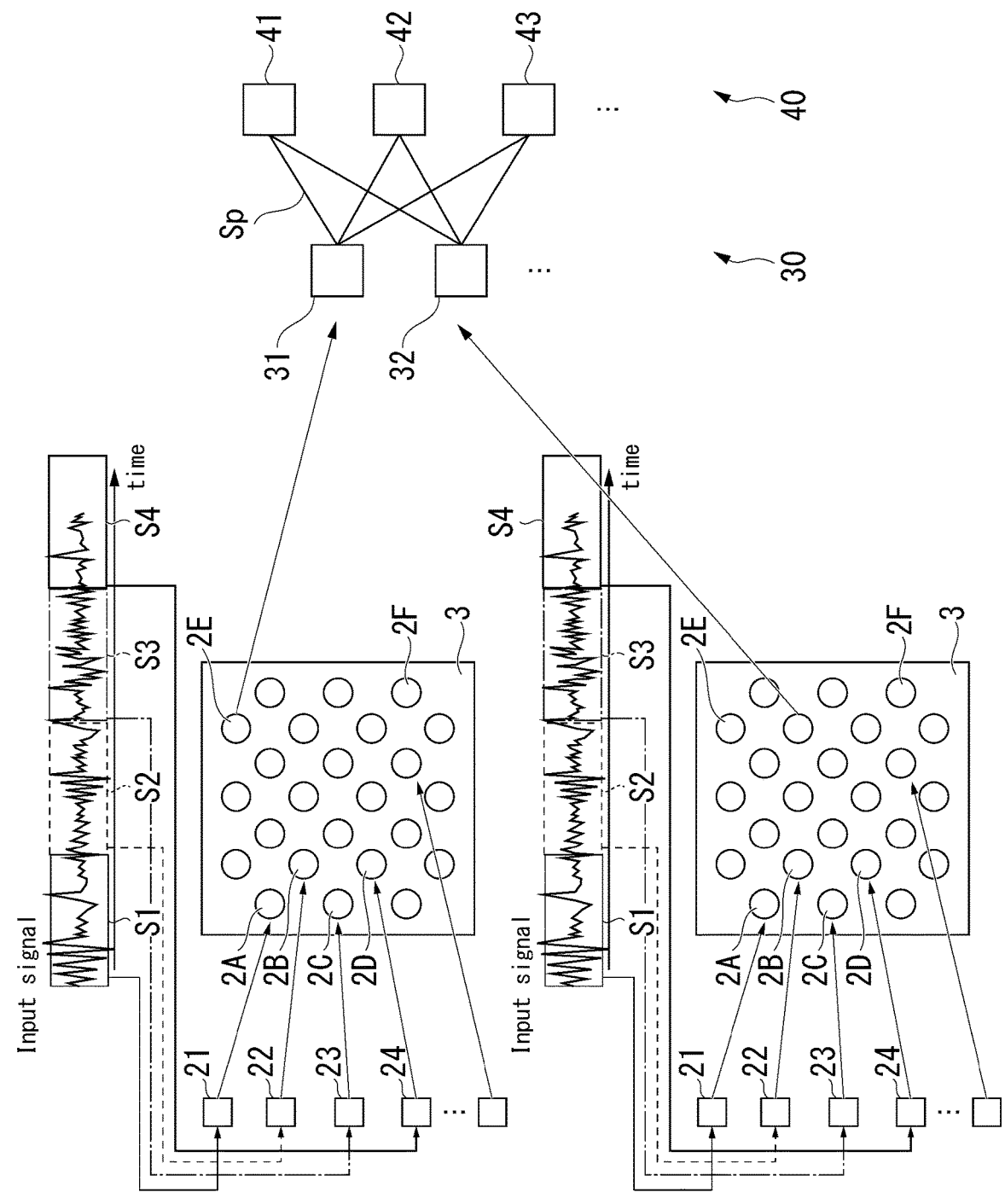
FIG. 15 is a schematic diagram illustrating another example of a neuromorphic element.

FIG. 15 is a schematic diagram illustrating another example of a neuromorphic element. The neuromorphic element shown in FIG. 15 differs from the example shown in FIG. 14 in that, the reservoir elements 10 are arranged in parallel and the output parts 30 connected to the respective reservoir elements 10 are shared. By having such a structure, it is possible to simultaneously recognize signals having different outputs and signal speeds from multiple input terminals, and a multimodal reservoir device can be realized.

As described above, in the first ferromagnetic layer 1, the magnetization rotation from each second ferromagnetic layer 2 interferes with each other, and the magnetic domain formed between them reflects the interaction. The signals input from the input part 20 interact with each other in the first ferromagnetic layer 1 to generate one magnetic state in the first ferromagnetic layer 1. That is, the signal input from the input part 20 is compressed into one magnetic state in the first ferromagnetic layer 1. Accordingly, the neuromorphic element 100 in accordance with the first embodiment appropriately compresses the signals with the reservoir element 10. By compressing the signals, only the output part 30 is responsible for learning, reducing the power consumption of the neuromorphic element 100. Also, the magnetic state of the first ferromagnetic layer 1 is held in a non-volatile state unless a new write current is applied.

By storing information in a nonvolatile manner, the reservoir element 10 is not limited by time. When time series data is input to the input part 20 of the reservoir element 10 and is extracted from the output part 30 and information processing is performed, it is necessary to match the input/output time interval with the time interval to be detected by the reservoir element 10. The operations of magnetization rotation and domain wall drive in the reservoir element 10 are generally completed in a time of 1 nsec to 1 μsec. However, since the movement of a person or an object generally occurs in a unit of time of about 1 sec, there is a large time difference between the operation speed of one terminal of the reservoir element 10 and the movement speed of the person or the object. In order for the reservoir element 10 to function, it is preferable that the influence of the operation of one terminal of the reservoir element 10 remains at least during the operation of the person or the object. Since the reservoir element 10 can hold input information in a non-volatile manner, even if there is a large time difference between the operating speed of one terminal of the reservoir element 10 and the operating speed of the person or the object, interference between the input signals in the reservoir element 10 can be maintained.

Second Embodiment

Figure 9:
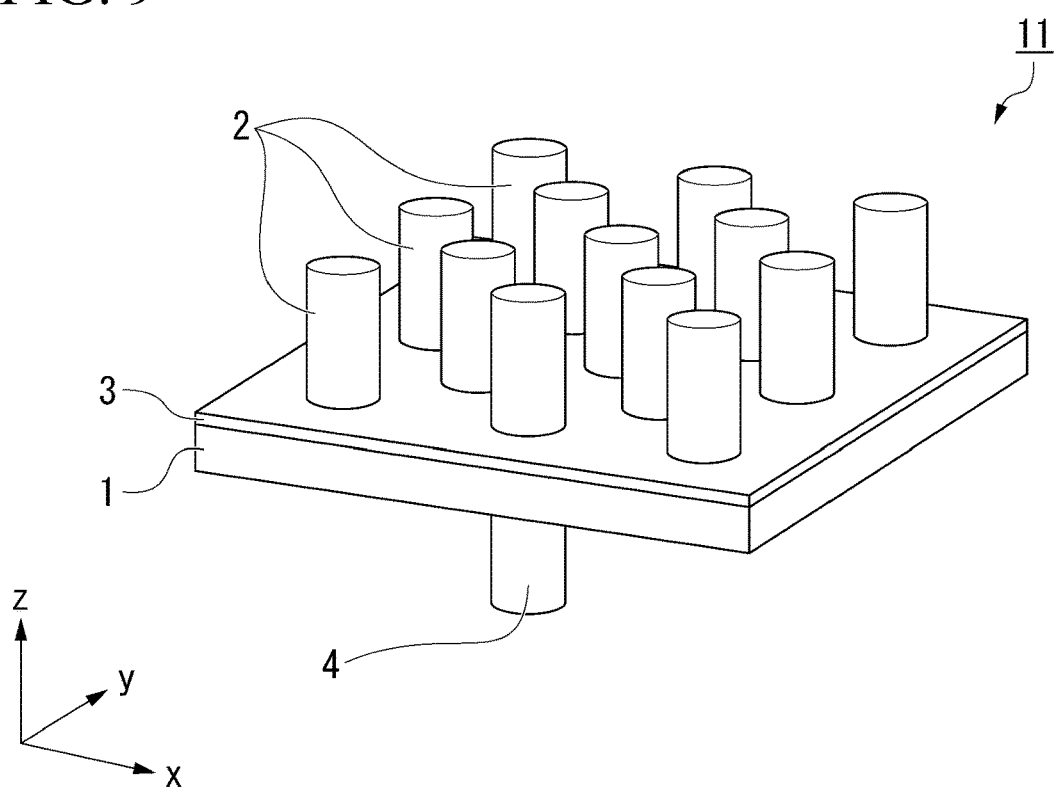
FIG. 9 is a perspective view of a reservoir element according to the second embodiment.

FIG. 9 is a cross-sectional view of a reservoir element according to the second embodiment. The reservoir element 11 according to the second embodiment differs from the reservoir element 10 according to the first embodiment in that there is no multiple via wirings 4. The other configuration is the same as the reservoir element 10 according to the first embodiment, and the description is omitted. Also, in FIG. 9, the same configuration as FIG. 1 is denoted by the same reference numerals.

In the reservoir element 11, there is only one via wiring 4. The via wiring 4 is electrically connected to the first ferromagnetic layer 1.

As shown in FIG. 1, when each of the via wirings 4 is disposed at a position corresponding to each of the second ferromagnetic layers 2, many of the write currents flow in the z-direction. In contrast, when only one via wiring 4 is provided, a portion of the writing current flows in the first ferromagnetic layer 1 in the xy-plane. The spin-polarized write current moves the magnetic wall, which is the boundary of the different magnetic domains. That is, if the via wiring 4 disposed in the reservoir element 11 is one, the magnetic wall moves efficiently in the first ferromagnetic layer 1, and the interaction between the signal input to the first second ferromagnetic layer 2 and the signal input to the other second ferromagnetic layer 2 is promoted.

Also, when only one via wiring 4 is provided, the distance between the second ferromagnetic layer 2 and the via wiring 4 differs in each of the second ferromagnetic layers 2. The amount of write current flowing on the xy-plane of the first ferromagnetic layer 1 depends on which second ferromagnetic layer 2 is input a signal. In other words, the ease of movement of the magnetic wall varies depending on which second ferromagnetic layer 2 the signal is input to. In other words, the reservoir element 11 preferentially outputs predetermined information from the signals input from the input part 20, and can provide the necessary information with a weight in advance.

The reservoir element 11 in accordance with the second embodiment can be applied to the neuromorphic element 100. In addition, the reservoir element 11 according to the second embodiment has the same effect as the reservoir element 10 according to the first embodiment. Also, in accordance with the second embodiment, the reservoir element 11 has different specificities for the ease of flow of the write current and can place heavier or lighter weight to the signal.

In addition, the reservoir element 11 according to the second embodiment can be modified. For example, the via wiring 4 need not be formed downwardly from one surface of the first ferromagnetic layer 1, but can be provided as a wiring on the side of the first ferromagnetic layer 1.

Third Embodiment

Figure 10:
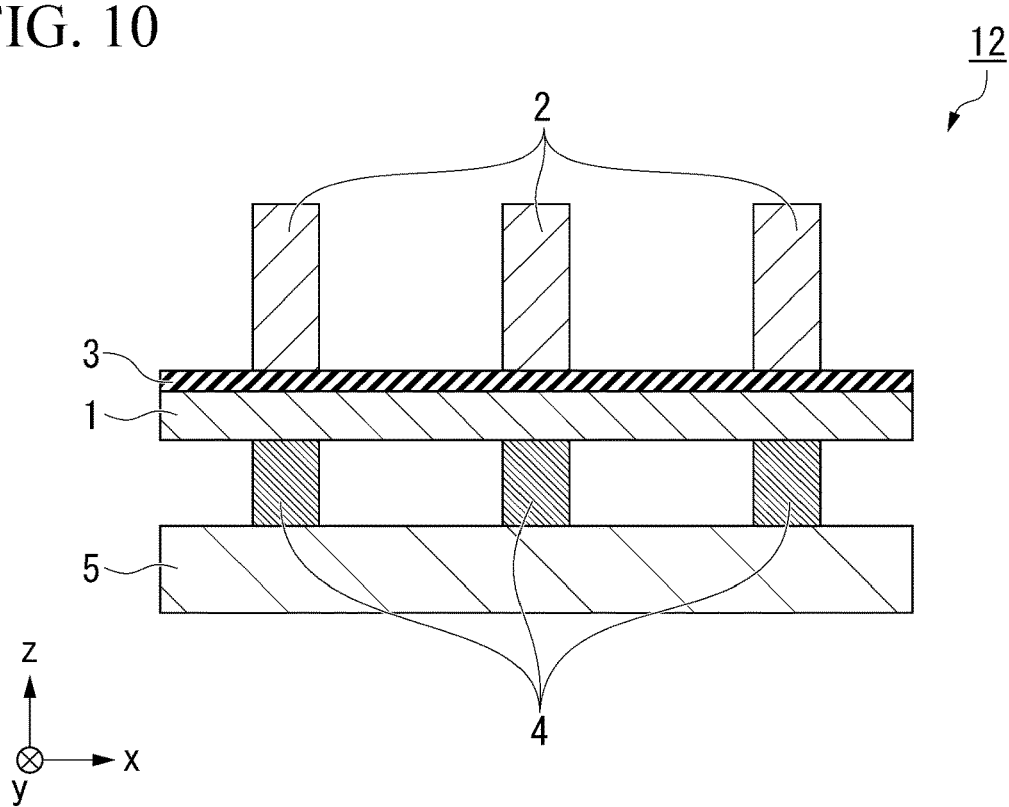
FIG. 10 is a side view of a reservoir element according to the third embodiment.

FIG. 10 is a cross-sectional view of a reservoir element according to the third embodiment. The reservoir element 12 in accordance with the third embodiment has the shared electrode layer 5, which is different from the reservoir element 10 in accordance with the first embodiment. The other configuration is the same as the reservoir element 10 according to the first embodiment, and the description is omitted. Also, in FIG. 10, the same configuration as FIG. 1 is denoted by the same reference numerals.

The shared electrode layer 5 connects at least two or more via wirings 4 of the via wirings 4. The shared electrode layer 5 extends continuously, for example, on the xy-plane. The shared electrode layer 5 is made of a material similar to that of the via wiring 4.

When the reservoir element 12 has the shared electrode layer 5, a portion of the write current flows into the xy-plane within the first ferromagnetic layer 1. The magnetic wall moves efficiently in the first ferromagnetic layer 1, facilitates the interaction between the signal input to the first second ferromagnetic layer 2 and the signal input to the other second ferromagnetic layers 2, and thus represents a more complex phenomenon.

The reservoir element 11 in accordance with the third embodiment can be applied to the neuromorphic element 100. In addition, the reservoir element 12 according to the third embodiment has the same effect as the reservoir element 10 according to the first embodiment.

Fourth Embodiment

Figure 11:
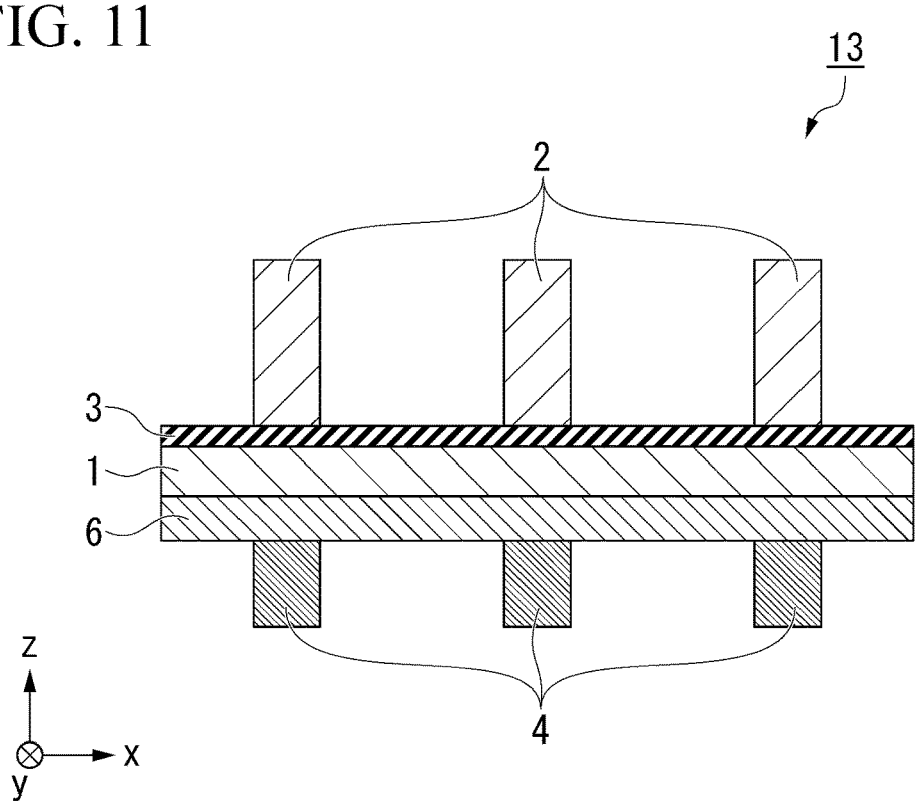
FIG. 11 is a side view of a reservoir element according to the fourth embodiment.

FIG. 11 is a cross-sectional view of a reservoir element according to the fourth embodiment. The reservoir element 13 in accordance with the fourth embodiment has the magnetic interference layer 6, which is different from the reservoir element 10 in accordance with the first embodiment. The other configuration is the same as the reservoir element 10 according to the first embodiment, and the description is omitted. Also, in FIG. 11, the same configuration as FIG. 1 is denoted by the same reference numerals.

The magnetic interference layer 6 contacts the first ferromagnetic layer 1 on the surface opposite to the surface with the nonmagnetic layer 3. The magnetic interference layer 6 extends continuously on the xy-plane.

The magnetic interference layer 6 has a lower coercivity than the first ferromagnetic layer 1 and has superior soft magnetic properties. That is, the magnetization of the magnetic interference layer 6 is more easily rotated than the magnetization of the first ferromagnetic layer 1. The magnetic interference layer 6 is an alloy containing, for example, any of Fe—Si, Fe—Si—Al, Fe—Co—V, Ni—Fe, and Co—Fe—Si—B.

When the writing current is applied to the reservoir element 13, a different magnetic domain is formed in the magnetic interference layer 6, similar to the first ferromagnetic layer 1, and a magnetic wall is formed. The magnetic wall of the magnetic interference layer 6 is more mobile than the magnetic wall of the first ferromagnetic layer 1. The magnetic interference layer 6 is responsible for long-range magnetic correlation.

When the reservoir element 13 has the magnetic interference layer 6, the freedom of material selection of the first ferromagnetic layer 1 is increased.

The magnetoresistance change is caused by a change in the magnetic state of two magnetic materials (the first ferromagnetic layer 1 and the second ferromagnetic layer 2) that sandwich the nonmagnetic layer 3. Preferably, the first ferromagnetic layer 1 includes a material that is easy to obtain coherent tunneling effects with the second ferromagnetic layer 2 (e.g., MgO, MgAl$_2$O$_4$).

On the other hand, materials that are easy to obtain coherent tunneling effects are not necessarily materials in which the magnetic walls easily move. The first ferromagnetic layer 1 is responsible for the magnetoresistance change, and the magnetic interference layer 6 is responsible for the long-range magnetic correlation. That is, the first ferromagnetic layer 1 does not need to be a material in which the magnetic walls easily move, and the freedom of selecting the material of the first ferromagnetic layer 1 is increased.

The reservoir element 13 in accordance with the fourth embodiment can be applied to the neuromorphic element 100. In addition, the reservoir element 13 according to the fourth embodiment has the same effect as the reservoir element 10 according to the first embodiment. Further, by dividing the functions of the first ferromagnetic layer 1 and the magnetic interference layer 6, the reservoir element 13 according to the fourth embodiment facilitates the interaction between the signal input to the first second ferromagnetic layers 2 and the signal input to the other second ferromagnetic layer 2, and thus can represent a more complex phenomenon.

Figure 16:
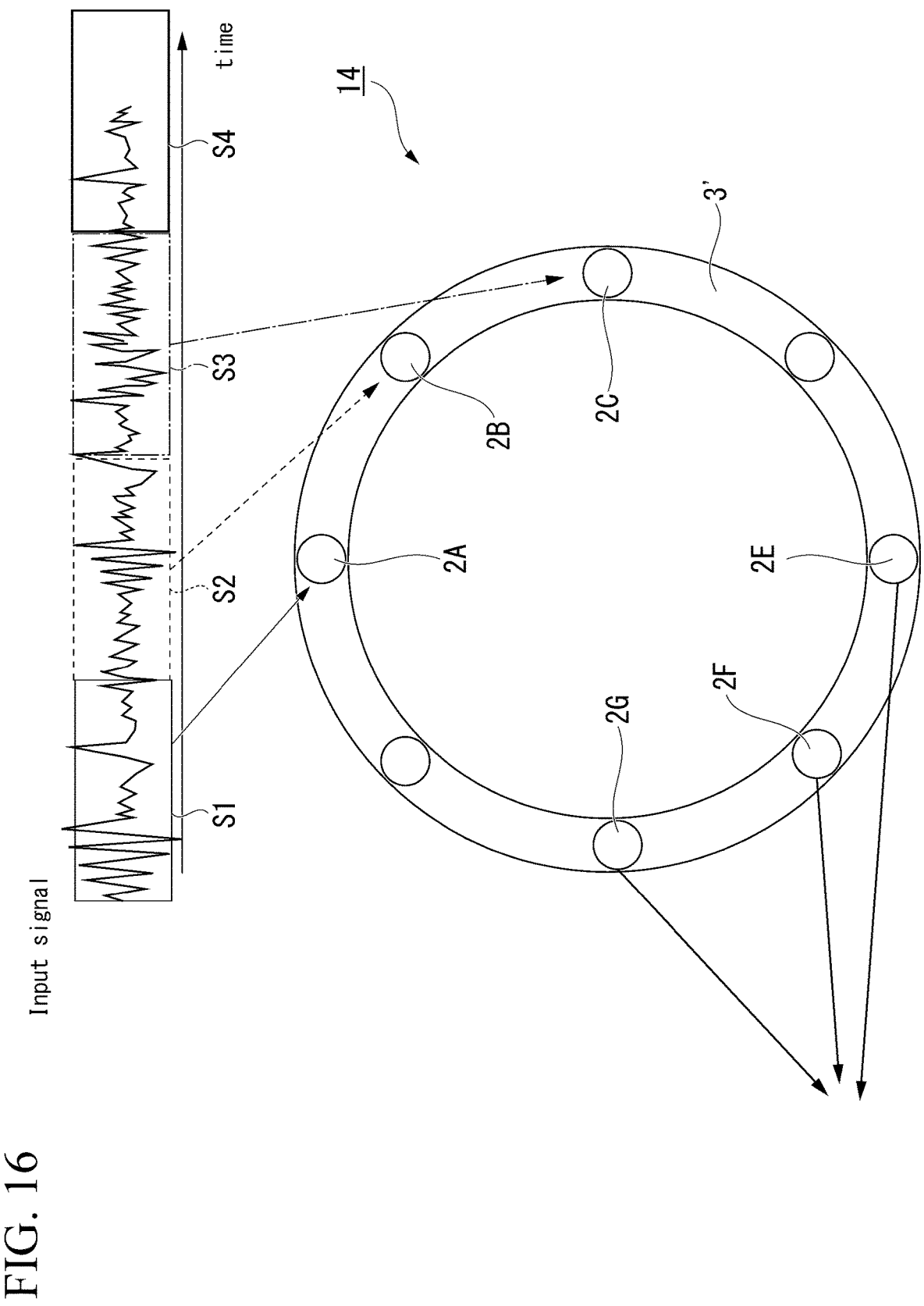
FIG. 16 is a plan view of a reservoir element according to a fifth embodiment.

FIG. 16 is a plan view of a reservoir element according to the fifth embodiment. The reservoir element 14 in accordance with the fifth embodiment differs from the reservoir element 10 in accordance with the first embodiment in that the first ferromagnetic layer and the nonmagnetic layer 3' are annular and the plurality of second ferromagnetic layers 2 are scattered along the first ferromagnetic layer which is circular. The other configuration is the same as the reservoir element 10 according to the first embodiment, and the description is omitted. Also, in FIG. 16, the same configuration as in FIG. 1 is denoted by the same reference numerals.

The input signal is divided, for example, by time domain, and is input to the reservoir element 14 as multiple signals S1, S2, S3, S4, etc. For example, the signal S1 is input to the second ferromagnetic layer 2A, the signal S2 is input to the second ferromagnetic layer 2B, and the signal S3 is input to the second ferromagnetic layer 2C. Signals S1, S2, S3, and S4 . . . the magnetic rotation of some of the first ferromagnetic layer. Magnetic rotation extending from each of the second ferromagnetic layers 2A, 2B, and 2C propagates along the circumference and interferes with each other.

The magnetization state of the first ferromagnetic layer is output, for example, from the second ferromagnetic layers 2E, 2F, and 2G. When the second ferromagnetic layers 2A, 2B, and 2C in which the signal is input and the second ferromagnetic layers 2E, 2F, and 2G in which the signal is output are set to be different terminals, a portion of the write current flows in a circumferential direction along the first ferromagnetic layer. The circumferentially flowing spin polarization current moves the magnetic wall and facilitates interference of the magnetization rotation extending from the respective second ferromagnetic layers 2A, 2B, and 2C.

In addition, the input position of the signal to the second ferromagnetic layer and the output position of the signal from the second ferromagnetic layer can be changed sequentially.

Although one preferred embodiment of the present disclosure has been described in detail, the present disclosure is not limited to this embodiment, and various modifications and changes may be made within the scope of the present disclosure as set forth in the appended claims.

For example, the characteristic configuration of the reservoir element 14 according to the fifth embodiment may be combined to the reservoir element 10 according to the first embodiment.

EXPLANATION OF REFERENCES

1: First ferromagnetic layer
2, 2A, 2B, 2C, 2D, 2E, 2F, 2G: Second ferromagnetic layer
2': Ferromagnetic layer
3, 3': Nonmagnetic layer
4: Via wiring
5: Shared electrode layer
6: Magnetic interference layer
10, 10A, 10B, 10C, 11, 12, 13, 14: Reservoir element
20: Input part
21, 22, 23, 24: Input terminal
30: Output part
31, 32: Output terminal
40: Second output terminal
41, 42, 43: Terminal
100: Neuromorphic element
A: Bundle
Cp: Chip
HM: Hard mask
I: Interlayer insulation film
Sb: Substrate
Sp: Synapse

What is claimed is:

1. A reservoir element comprising:
   a first ferromagnetic layer;
   a plurality of second ferromagnetic layers positioned in a first direction with respect to the first ferromagnetic layer and spaced apart from each other in a plan view from the first direction;
   a nonmagnetic layer positioned between the first ferromagnetic layer and the second ferromagnetic layers; and
   a magnetic interference layer that: (i) contacts the first ferromagnetic layer on a first surface opposite to a second surface on which the nonmagnetic layer is arranged, (ii) has a coercivity lower than a coercivity of the first ferromagnetic layer, and (iii) extends continuously on the first surface.

2. The reservoir element according to claim 1, further comprising at least one via wiring electrically connected to the first ferromagnetic layer on the first surface through the magnetic interference layer.

3. The reservoir element according to claim 2, wherein the at least one via wiring comprises a plurality of via wirings, and
   each of via wirings is located on a position overlapping with each of the second ferromagnetic layers, respectively, in the plan view from the first direction.

4. The reservoir element according to claim 1, wherein the magnetic interference layer is made of an alloy containing one of Fe—Si, Fe—Si—Al, Fe—Co—V, Ni—Fe, and Co—Fe—Si—B.

5. The reservoir element according to claim 3, further comprising a shared electrode connecting two or more of the via wirings.

6. The reservoir element according to claim 1, wherein the second ferromagnetic layers are arranged in a hexagonal lattice form in the plan view from the first direction.

7. The reservoir element according to claim 1, wherein the second ferromagnetic layers form plurality of bundles, the second ferromagnetic layers being close-packed in each of the bundles in the plan view from the first direction, and
   the second ferromagnetic layers in each of the bundles are arranged in a hexagonal lattice form.

8. The reservoir element according to claim 2, wherein the second ferromagnetic layers are arranged in a hexagonal lattice form in the plan view from the first direction.

9. The reservoir element according to claim 3, wherein the second ferromagnetic layers are arranged in a hexagonal lattice form in the plan view from the first direction.

10. The reservoir element according to claim 4, wherein the second ferromagnetic layers are arranged in a hexagonal lattice form in the plan view from the first direction.

11. The reservoir element according to claim 5, wherein the second ferromagnetic layers are arranged in a hexagonal lattice form in the plan view from the first direction.

12. The reservoir element according to claim 7, wherein the second ferromagnetic layers are arranged in a hexagonal lattice form in the plan view from the first direction.

13. The reservoir element according to claim 1, wherein a different magnetic domain and a magnetic wall are formed in the magnetic interference layer.

14. The reservoir element according to claim 1, wherein the first ferromagnetic layer contains at least one of MgO and $MgAl_2O_4$.

* * * * *